(12) United States Patent
Kim et al.

(10) Patent No.: US 9,123,670 B2
(45) Date of Patent: Sep. 1, 2015

(54) DISPLAY DEVICE AND METHOD OF MANUFACTURING THE SAME

(75) Inventors: Won-Jong Kim, Yongin (KR); Joon-Gu Lee, Yongin (KR); Ji-Young Choung, Yongin (KR); Jin-Baek Choi, Yongin (KR); Yeon-Hwa Lee, Yongin (KR); Young-Woo Song, Yongin (KR); Jong-Hyuk Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 12 days.

(21) Appl. No.: 13/305,660

(22) Filed: Nov. 28, 2011

(65) Prior Publication Data
US 2012/0267651 A1    Oct. 25, 2012

(30) Foreign Application Priority Data
Apr. 25, 2011 (KR) .......................... 10-2011-0038446

(51) Int. Cl.
*H01L 29/20* (2006.01)
*H01L 33/00* (2010.01)
*H01L 51/00* (2006.01)
*H01L 27/32* (2006.01)
*H01L 51/52* (2006.01)

(52) U.S. Cl.
CPC .......... *H01L 27/322* (2013.01); *H01L 51/5253* (2013.01)

(58) Field of Classification Search
CPC ... H01L 51/50; H01L 51/5253; H01L 27/322; H01L 33/00
USPC ................. 257/89, E33.001, 98; 438/34, 35
See application file for complete search history.

(56) References Cited

U.S. PATENT DOCUMENTS

| | | | |
|---|---|---|---|
| 5,315,993 A * | 5/1994 | Alcala ........................... | 600/341 |
| 7,452,614 B2 | 11/2008 | Drachev et al. | |
| 7,951,618 B2 | 5/2011 | Drachev et al. | |
| 8,835,947 B2 * | 9/2014 | Ichinose et al. ................. | 257/89 |
| 8,921,842 B2 * | 12/2014 | Park et al. ....................... | 257/40 |
| 8,921,843 B2 * | 12/2014 | Song et al. ...................... | 257/40 |

(Continued)

FOREIGN PATENT DOCUMENTS

| | | |
|---|---|---|
| CN | 1607876 A | 4/2005 |
| CN | 101008688 A | 8/2007 |

(Continued)

OTHER PUBLICATIONS

Chinese Office Action dated Mar. 27, 2015 for Chinese Patent Application No. CN201110309285.3 which shares priority of Korean Patent Application No. KR 10-2011-0038446 with captioned U.S. Appl. No. 13/305,660, and cites the above-identified references numbered 1-4.

*Primary Examiner* — Chuong A Luu
*Assistant Examiner* — Moazzam Hossain
(74) *Attorney, Agent, or Firm* — Knobbe, Martens, Olson & Bear, LLP

(57) ABSTRACT

In one aspect, a display device comprising: a lower substrate, a light-emitting element formed on the lower substrate and comprising a plurality of pixels, an upper substrate disposed on the light-emitting element with a gap therebetween sealed with a sealant, a filler filling the gap between the light-emitting element and the upper substrate, and a light-absorbing material formed between the lower substrate and the upper substrate and selectively absorbing light of a certain wavelength range is provided.

18 Claims, 8 Drawing Sheets

(56) References Cited

U.S. PATENT DOCUMENTS

| | | | |
|---|---|---|---|
| 8,941,133 B2* | 1/2015 | Kim et al. | 257/89 |
| 2004/0242115 A1* | 12/2004 | Yanagawa | 445/25 |
| 2005/0077816 A1* | 4/2005 | Yamada et al. | 313/503 |
| 2007/0278493 A1* | 12/2007 | Sato | 257/72 |
| 2007/0293666 A1 | 12/2007 | Minami et al. | |
| 2008/0084681 A1* | 4/2008 | Naito et al. | 361/818 |
| 2009/0206754 A1* | 8/2009 | Usui et al. | 313/635 |
| 2011/0024780 A1* | 2/2011 | Park et al. | 257/98 |
| 2011/0095276 A1* | 4/2011 | Imai et al. | 257/40 |
| 2012/0197026 A1* | 8/2012 | Maeda et al. | 548/455 |
| 2013/0001609 A1* | 1/2013 | Ichinose et al. | 257/89 |
| 2014/0124765 A1* | 5/2014 | Omoto | 257/40 |

FOREIGN PATENT DOCUMENTS

| | | |
|---|---|---|
| CN | 101374675 A | 2/2009 |
| KR | 10-2005-0093696 A | 9/2005 |
| KR | 10-2007-0085429 A | 8/2007 |
| KR | 10-2009-0022692 A | 3/2009 |
| TW | 200618731 A | 6/2006 |

* cited by examiner

DISPLAY DEVICE AND METHOD OF MANUFACTURING THE SAME

CROSS-REFERENCE TO RELATED APPLICATIONS

This application claims priority from Korean Patent Application No. 10-2011-0038446 filed on Apr. 25, 2011 in the Korean Intellectual Property Office, the disclosure of which is incorporated herein by reference in its entirety.

BACKGROUND

1. Field

This disclosure relates to a display device and a method of manufacturing the same, and more particularly, to a display device with improved color purity and a method of manufacturing the display device.

2. Description of the Related Technology

The rapid development of the information and technology (IT) industry is dramatically increasing the use of display devices. Recently, there have been demands for display devices that are lightweight and thin, consume low power and provide high resolution. To meet these demands, various display devices (such as liquid crystal displays and organic light-emitting displays) having a plurality of metal wirings and a light-emitting element are being developed.

A display device such as a liquid crystal display or an organic light-emitting display may include an organic compound. The organic compound may deteriorate when exposed to moisture and/or oxygen. In addition, metal wirings formed on a substrate of a highly reactive metal may be oxidized by moisture and/or oxygen, resulting in defective pixels. For this reason, an encapsulating member may be provided on a light-emitting element to protect components of the display device.

Each pixel in a conventional display device emits light of red, green and blue. As the wavelength of emitted light of each color is closer to a unique wavelength of the color, the color can be reproduced more accurately. For example, a unique wavelength of red light is 630 nm which is a central peak of the wavelength distribution of the red light. As the red light includes a greater proportion of light at a wavelength of 630 nm, the color purity of the red light increases.

To achieve high color purity, various methods have been suggested, including increasing the intensity of light at the central peak using a resonance structure and controlling the amount of light emitted from the light-emitting element. However, these methods hardly improve color purity.

SUMMARY

Aspects of the present disclosure provide a display device configured to achieve high color purity without a significant increase in cost and a method of manufacturing the display device.

Aspects of the present disclosure also provide a display device configured to achieve high color purity without affecting transmittance and, consequently, luminance.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a display device comprising: a lower substrate, a light-emitting element formed on the lower substrate and comprising a plurality of pixels, an upper substrate disposed on the light-emitting element with a gap therebetween sealed with a sealant, a filler filling the gap between the light-emitting element and the upper substrate, and a light-absorbing material formed between the lower substrate and the upper substrate and selectively absorbing light of a certain wavelength range.

According to another aspect of the present disclosure, there is provided a display device comprising: a lower substrate, a light-emitting element formed on the lower substrate and comprising a plurality of pixels, each comprising a plurality of subpixels, an upper substrate disposed on the light-emitting element with a gap therebetween sealed with a sealant, a filler filling the gap between the light-emitting element and the upper substrate, and a light-absorbing layer formed between the lower substrate and the upper substrate and selectively absorbing light of a certain wavelength range, wherein each of the pixels comprises subpixels which respectively emit red light, green light, and blue light, and the light-absorbing layer is formed at a position corresponding to each of the subpixels and is made of a material which absorbs light of a different wavelength region for each of the subpixels.

According to another aspect of the present disclosure, there is provided a method of manufacturing a display device, the method comprising: forming a light-emitting element on a lower substrate, providing a filler and mixing the filler with a light-absorbing material which selectively absorbs light of a certain wavelength range, providing the filler on the light-emitting element, coating a portion of the lower substrate with a sealant, and attaching an upper substrate to the sealant so as to seal a space between the lower substrate and the upper substrate.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
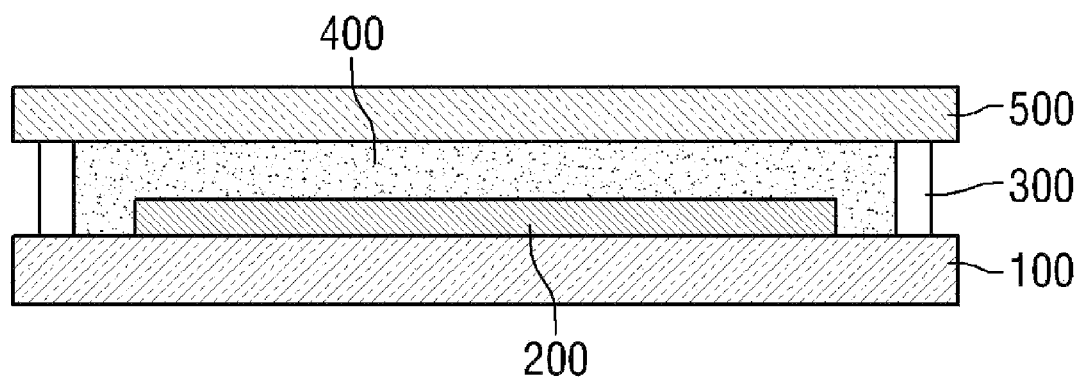
FIG. 1 is a cross-sectional view illustrating the schematic structure of a display device according to an exemplary embodiment of the present disclosure.

Exemplary embodiments of the present disclosure will hereinafter be described more fully with reference to the accompanying drawings, in which preferred embodiments are shown. However, these embodiments are only exemplary, and this disclosure is not limited thereto and may, however, be embodied in different forms and should not be construed as limited to the embodiments set forth herein. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Hereinafter, a display device according to an exemplary embodiment of the present disclosure will be described with reference to FIGS. 1 and 2. The display device according to the current exemplary embodiment includes a lower substrate 100, a light-emitting element 200 formed on the lower substrate 100, a upper substrate 500 disposed on the light-emitting element 200 with a gap therebetween sealed with a sealant 300, a filler 400 filling the gap between the light-emitting element 200 and the upper substrate 500, and a light-absorbing material formed between the lower substrate 100 and the upper substrate 500 and absorbing light of a certain wavelength range.

The lower substrate 100 may be made of a transparent glass material containing $SiO_2$ as a main component. The lower substrate 100 may also be made of transparent plastic. The plastic that forms the lower substrate 100 may include an insulating organic material. Examples of the insulating organic material may include, but are not limited to, polyethersulphone (PES), polyacrylate (PAR), polyetherimide (PEI), polyethylene napthalate (PEN), polyethylene terephthalate (PET), polyphenylene sulfide (PPS), polyallylate, polyimide, polycarbonate (PC), cellulose triacetate (TAC), cellulose acetate propionate (CAP), and a combination of these materials.

In a bottom emission display device in which an image is realized toward the lower substrate 100, the lower substrate 100 should be made of a transparent material. However, in a top emission display device in which an image is realized away from the lower substrate 100, the lower substrate 100 may not necessarily be made of a transparent material.

For example, in a top emission display device, the lower substrate 100 may be made of an opaque metal. When the lower substrate 100 is made of metal, it may contain one or more materials selected from the group consisting of Fe, Cr, Mn, Ni, Ti, Mo, and stainless steel (SUS). However, the material that forms the lower substrate 100 is not limited to the above materials. The lower substrate 100 may also be made of metal foil.

The light-emitting element 200 can be formed on the lower substrate 100. The light-emitting element 200 can emit light by controlling a thin-film transistor (TFT) of each pixel according to a driving signal transmitted from a driving circuit. Accordingly, a desired image can be displayed. As described above, light-emitting elements may be divided into bottom emission light-emitting elements in which emitted light proceeds toward the lower substrate 100 and top emission light-emitting elements in which emitted light proceeds toward the upper substrate 500. All types of light-emitting elements 200 can be applied to the display device according to the current exemplary embodiment.

The light-emitting element 200 may include liquid crystals which are driven by an electric field applied by a TFT of each pixel. In addition, the light-emitting element 200 may be an organic light-emitting element in which an organic light-emitting layer emits light by itself in response to an electric field formed by the TFT of each pixel. In this case, the light-emitting element 200 may include a plurality of organic light emitters connected in a matrix pattern between a plurality of scan lines and a plurality of data lines to define the pixels, respectively.

In a passive matrix display device, the organic light emitters may be connected in a matrix pattern between the scan lines and the data lines. In an active matrix display device, the organic light emitters may be connected in a matrix pattern between the scan lines and the data lines, and TFTs for controlling the operation of the organic light emitters and capacitors for sustaining signals may further be implemented.

A case where the light-emitting element 200 according to the current exemplary embodiment can be a top emission organic light-emitting element will now be described with reference to FIG. 2. However, the type of the light-emitting element 200 according to the present embodiments is not limited to the top emission type.

In some embodiments, the light-emitting element 200 of the display device may include a buffer layer 202, a semiconductor layer 204, a gate insulating film 206, a gate electrode 210, a first interlayer insulating film 212, source/drain electrodes 214, a second interlayer insulating film 216, and a pixel defined layer 220 sequentially stacked on the lower substrate 100. However, the configuration of the light-emitting element 200 is not limited to this configuration. In some embodiments, the above components may be provided on the whole surface of the lower substrate 100 or part of the surface of the lower substrate 100 to form TFTs or capacitors.

As described above, the lower substrate 100 may be made of a transparent glass material containing $SiO_2$ as a main component. The lower substrate 100 may contain a transparent plastic or insulating organic material. In a top emission display device in which an image is realized away from the lower substrate 100, the lower substrate 100 may not necessarily be made of a transparent material. In some embodiments, the display device a bottom emission organic light-emitting display device. However, the embodiments are not limited to a bottom emission organic light-emitting display device.

In some embodiments, the buffer layer 202 can be formed on the lower substrate 100 to planarize the lower substrate 100 and prevent penetration of impurities into the lower substrate 100. The buffer layer 202 may be a single layer of $SiO_X$, $SiN_X$ or $SiO_2N_X$, or a multilayer of these materials.

In some embodiments, the semiconductor layer 204 may be formed on the buffer layer 202. In some embodiments, the semiconductor layer 204 may be made of various known semiconductor materials. For example, the semiconductor layer 204 may contain silicon (Si). For example, the semiconductor layer 204 may be an amorphous silicon (a-Si) layer or a polycrystalline silicon (p-Si) layer. In some embodiments, the semiconductor layer 204 may be made of, but is not limited to, Ge, GaP, GaAs, or AlAs.

In some embodiments, a portion of the semiconductor layer 204 may be doped with P- or N-type impurities. In some embodiments, the semiconductor layer 204 that constitutes a TFT may be partially doped with impurities to have semiconductor properties, and the semiconductor layer 204 that constitutes a capacitor may be formed as a conductor and entirely doped with impurities to form an electrode.

In some embodiments, the gate insulating film 206 may be formed on the semiconductor layer 204 to cover the semiconductor layer 204 and insulate the semiconductor layer 204 from the gate electrode 210. Like the buffer layer 202, the gate insulating film 206 may be a single layer of $SiO_2$, $SiN_X$ or $SiO_2N_X$, or a multilayer of these materials. In some embodiments, the gate insulating film 206 may be made of the same or different material as the buffer layer 202.

In some embodiments, the gate electrode 210 may be formed on the gate insulating film 206. In some embodiments, the gate electrode 210 transmits a gate signal to control the light emission of each pixel. In some embodiments, the gate electrode 210 may be a single layer of Al or an Al alloy, such as Cr—Al, Mo—Al or Al—Nd, or a multilayer of a Cr, Ti or Mo alloy and an Al alloy stacked on the Cr, Ti or Mo alloy.

In the current exemplary embodiment, a transparent electrode 208 may further be provided under the gate electrode 210. In some embodiments, the transparent electrode 208 may be made of a transparent conductive material, such as carbon nanotubes or metal nanowires, or a metal oxide such as ITO and/or IZO.

In the current exemplary embodiment, a TFT may include the transparent electrode 208 and a gate electrode 210. In some embodiments, the transparent electrode 208 can be made of ITO. In some embodiments, the gate electrode 210 can have a triple-layered structure of Mo—Al—Mo successively stacked on the transparent electrode 208.

In some embodiments, the transparent electrode 208 of a predetermined width may be formed not only in a TFT region but also in a capacitor region and a light-emitting portion.

In some embodiments, the first interlayer insulating film 212 may be formed on the gate electrode 210. In some embodiments, the first interlayer insulating film 212 can electrically insulate the gate electrode 210 from the source/drain electrodes 214. In some embodiments, the first interlayer insulating film 212 may be a single layer of $SiO_2$, $SiN_X$ or $SiO_2N_X$, or a multilayer of these materials. For example, like the buffer layer 202. In some embodiments, contact holes for forming the source/drain electrodes 214 may be formed in the interlayer insulating film 212.

In some embodiments, the source/drain electrodes 214 may be formed on the first interlayer insulating film 212 and may be electrically connected to the semiconductor layer 204 by the contact holes. In some embodiments, the source/drain electrodes 214 may be made of any one material selected from Mo, Cr, W, MoW, Al, Al—Nd, Ti, TiN, Cu, a Mo alloy, an Al alloy, and a Cu alloy. In some embodiments, the source/drain electrodes 214 may also be formed as a triple layer of Mo—Al—Mo or Ti—Al—Ti.

In some embodiments, the second interlayer insulating film 216 may be formed on the source/drain electrodes 214. In some embodiments, the second interlayer insulating film 216 electrically insulates the source/drain electrodes 214 from a pixel electrode 218. In some embodiments, a contact hole can be formed in a portion of the second interlayer insulating film 216, and one of the source/drain electrodes 214 may be connected to the pixel electrode 218 by the contact hole.

In some embodiments, the second interlayer insulating film 216 may be made of the same material as the first interlayer insulating film 212. For example, the second interlayer insulating film 216 may be a single layer of $SiO_2$, $SiN_X$ or $SiO_2N_X$, or may be a multilayer of these materials.

In some embodiments, the pixel electrode 218 may be formed on the second interlayer insulating film 216 and may be electrically connected to one of the source/drain electrodes 214 by the contact hole formed in the second interlayer insulating film 216.

In some embodiments, the pixel electrode 218 forms an electric field with a common electrode 224. In some embodiments, the injected holes and electrons combine to form excitons, and light can be emitted as the excitons drop from an excited state to a ground state in an organic light-emitting layer 222.

In some embodiments, the pixel defined layer 220 may be formed on the second interlayer insulating film 216. In some embodiments, the pixel defined layer 220 may be formed on the whole surface of the lower substrate 100 to cover the TFTs and the capacitors. In some embodiments, the pixel defined layer 220 may expose all or part of the pixel electrode 218 to define a pixel region. In some embodiments, the pixel defined layer 220 may be made of an inorganic material, such as $SiO_2$, $SiN_x$ or $SiO_2N_x$, or may be a multilayer of these materials.

In some embodiments, the organic light-emitting layer 222 may be formed on the pixel electrode 218. In some embodiments, the organic light-emitting layer 222 may include a hole injecting layer, a hole transporting layer, an emitting layer, an electron transporting layer, and an electron injecting layer stacked sequentially.

As described above, holes injected from the hole injecting layer and electrons injected from the electron injecting layer can combine together in the emitting layer to generate light. In the case of a top emission organic light-emitting display device, the generated light can be emitted upward as shown in FIG. 2 to exit through the common electrode 224, the filler 400 and the upper substrate 500 above the emitting layer.

In some embodiments, the pixel electrode 218 can be an anode electrode which is a hole injecting electrode, and the common electrode 224 can be a cathode electrode which is an electron injecting electrode. However, the embodiments are not limited to this case. In some embodiments, the pixel electrode 218 can be a cathode, and the common electrode 222 can be an anode, depending on a method of driving the display device.

In the display device according to the current exemplary embodiment, a reflective electrode may be used for the pixel electrode 218, and a transmissive or semi-transmissive electrode may be used for the common electrode 224, so that the light-emitting element 200 can emit light toward the upper substrate 500.

In some embodiments, the organic light-emitting layer 222 may further include an auxiliary hole transporting layer which helps holes to easily reach the emitting layer. In some embodiments, the hole injecting layer may be made of the same material as the hole transporting layer.

In some embodiments, the common electrode 224 can be deposited on the organic light-emitting layer 222 and may be made of a metal. For example, a metal selected from the group consisting of, but not limited to, Cu and Ag. In some embodiments, the common electrode 224 can form an electric field together with an anode electrode (i.e., the transparent electrode 208) under the organic light-emitting layer 222, thereby causing the organic light-emitting layer 222 to emit light.

In some embodiments, a capping layer (not shown) may be additionally formed on the common electrode 224 to protect the internal components, i.e., the organic light-emitting layer 222 and the common electrode 224. In particular, the capping layer can protect the common electrode 224 from air to prevent oxidation of the common electrode 224. There are no restrictions on the material used to form the capping layer. In some embodiments, the capping layer can be made of an organic material.

In some embodiments, a plurality of layers may be stacked to form the light-emitting element 200 which emits light toward the top or bottom of the display device, thereby organizing the pixels.

Figure 2:
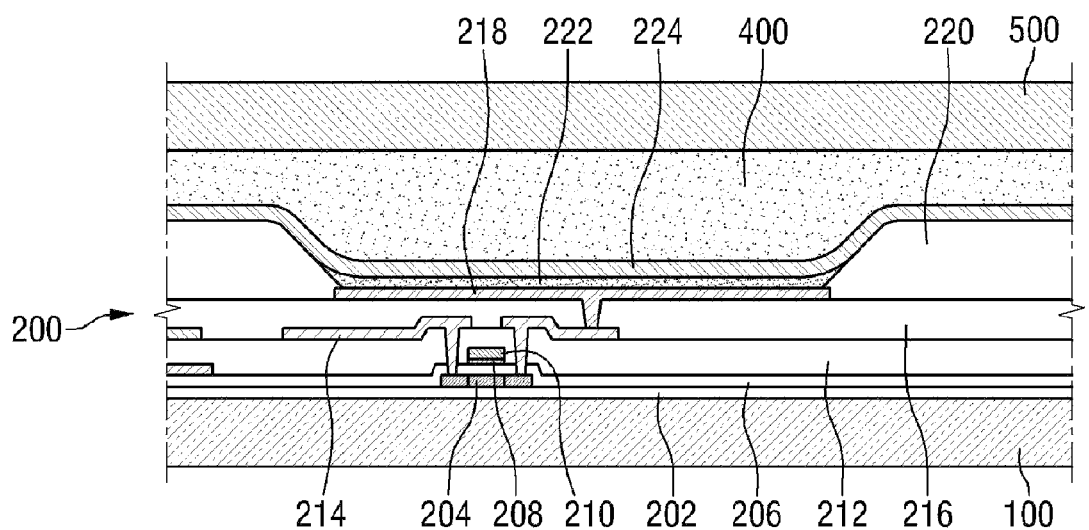
FIG. 2 is a cross-sectional view illustrating the exemplary configuration of a light-emitting element shown in FIG. 1.

Referring to FIGS. 1 and 2, the filler 400 may be provided on the light-emitting element 200. In some embodiments, the filler 400 may be interposed between the lower substrate 100 and the upper substrate 500 to fill the space between the lower substrate 100 and the upper substrate 500. In some embodiments, the filler 400 may increase the mechanical strength of the display device by filling the empty space between the lower substrate 100 and the upper substrate 500. That is, since the space inside the organic light-emitting display device is filled with the filler 400, the durability of the organic light-emitting display device against external impact can be increased.

In some embodiments, the filler 400 may contain one or more of a photocurable epoxy-based material and a photocurable acrylate-based material.

In some embodiments, the filler 400 may also contain a light-absorbing material which selectively absorbs light of a certain wavelength range, among light emitted from the light-emitting element 200. However, the embodiments are not limited thereto. In some embodiments, the light-absorbing material may be interposed at an arbitrary position between the lower substrate 100 and the upper substrate 500. That is, the light-absorbing material may be selectively formed at positions corresponding to the pixels (i.e., actual light-emitting regions) formed on the lower substrate 100. In the case of a top emission display device, the light-absorbing material may be coated on a surface of the upper substrate 500 to form a light-absorbing layer. Otherwise, the light-absorbing material may be spread within the lower substrate 100 or the upper substrate 500 as part of the lower substrate 100 or the upper substrate 500. In addition, the light-absorbing material may be selectively deposited adjacent to the emitting layer of the organic light-emitting layer 222 to maximize color purity. In the current exemplary embodiment, a case where the light-absorbing material is contained in the filler 400 will be described. However, this is merely for ease of description and not intended to limit the scope of the present embodiments.

Color filters of different colors may respectively be implemented in subpixels and convert white light emitted from the light-emitting element 200 into a desired color. Alternatively, the subpixels of the light-emitting element 200 may respectively and independently emit light of three primary colors. In some embodiments, a light-absorbing material which absorbs light of wavelengths excluding a corresponding wavelength of the color of each emitted light may be provided to increase the color purity of each of red light R, green light G and blue light B emitted from the light-emitting element 200. In some embodiments, the light-absorbing material can increase the color purity of each emitted light. In some embodiments, the filler 400 and the light-absorbing material will be described in detail later with reference to FIGS. 3A through 4C.

Referring back to FIG. 1, the upper substrate 500 is formed on the filler 400, and the space between the lower substrate 100 and the upper substrate 500 is sealed with the sealant 300.

In some embodiments, the sealant 300 can be placed on edges of the lower substrate 100 and the upper substrate 500 to bond the lower substrate 100 and the upper substrate 500 together. In some embodiments, the sealant 300 may contain an organic material with low moisture permeability.

In some embodiments, the upper substrate 500 may be made of the same material as the lower substrate 100. In particular, some embodiments provide a top emission display device like the display device according to the current exemplary embodiment, where the upper substrate 500 may be made of a transparent material to allow light emitted from the light-emitting element 200 to pass therethrough.

Figure 3A:
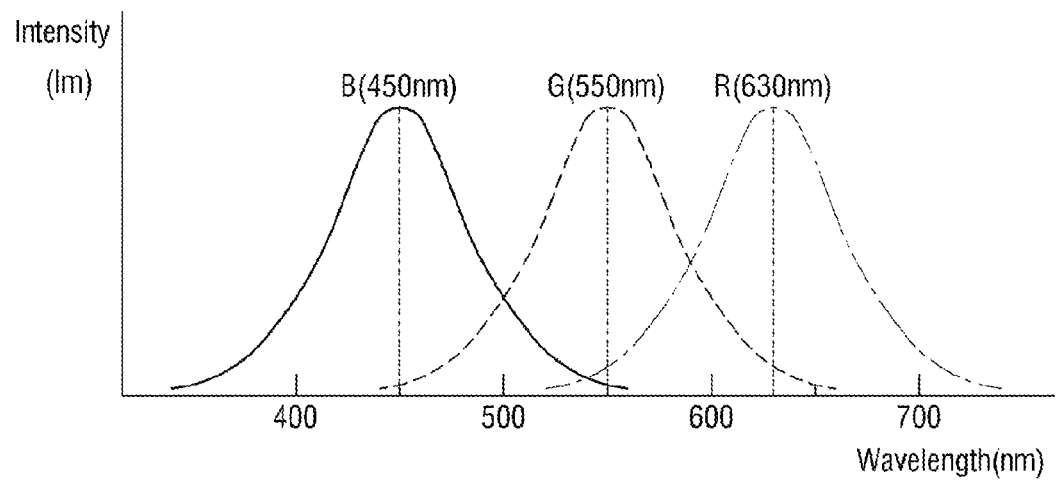
FIGS. 3A and 3B are diagrams illustrating the wavelength distribution of each color of light emitted from the light-emitting element of FIG. 1.
Figure 3B:
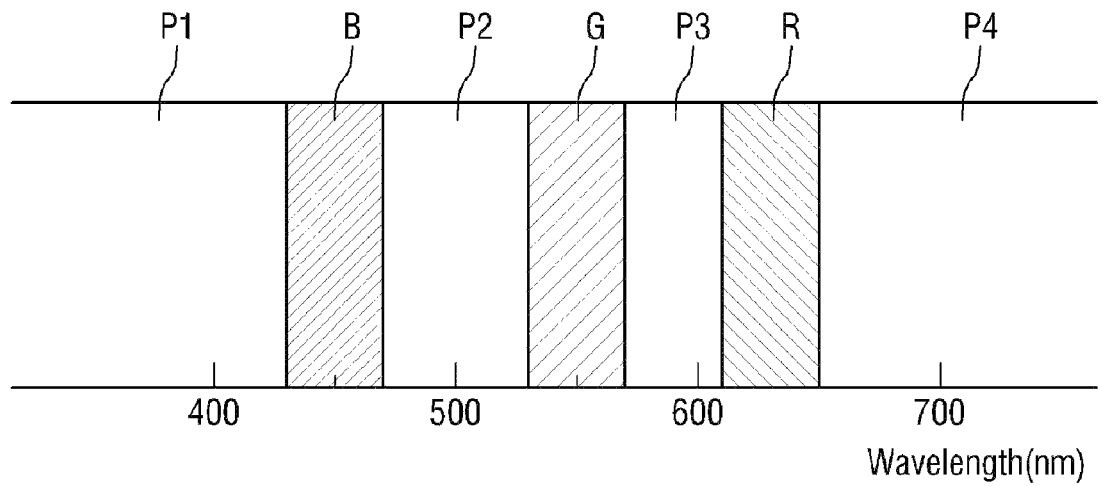
Figure 4A:
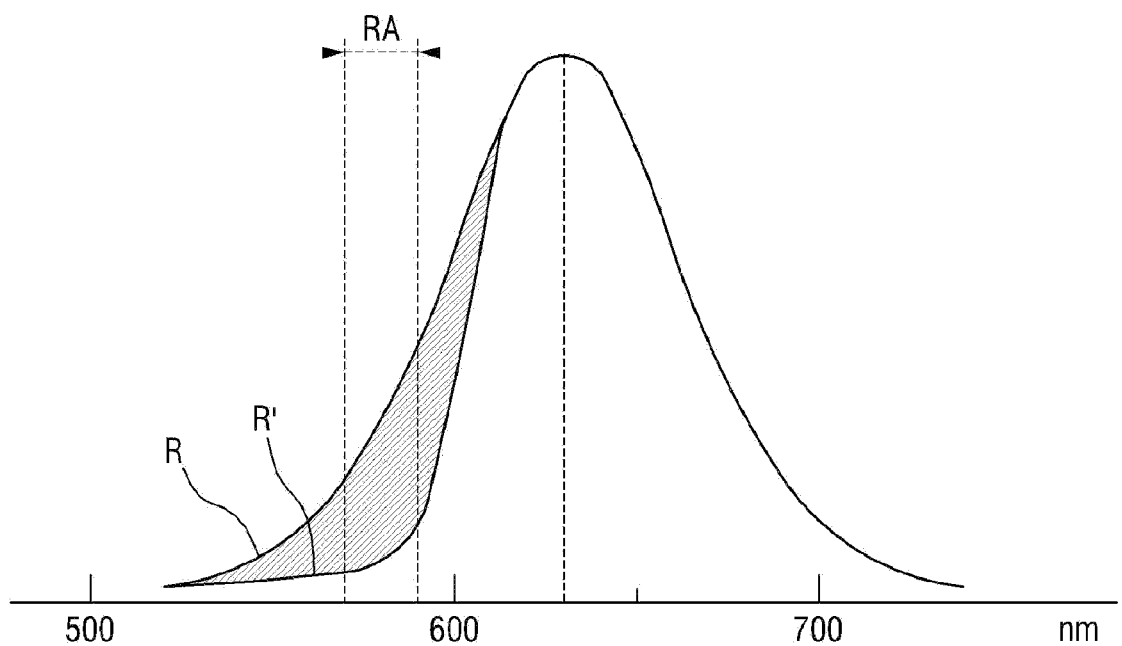
FIG. 4A is a diagram illustrating the wavelength distribution of red light that passed through a filler after having been emitted from the light-emitting element of FIG. 1.
Figure 4B:
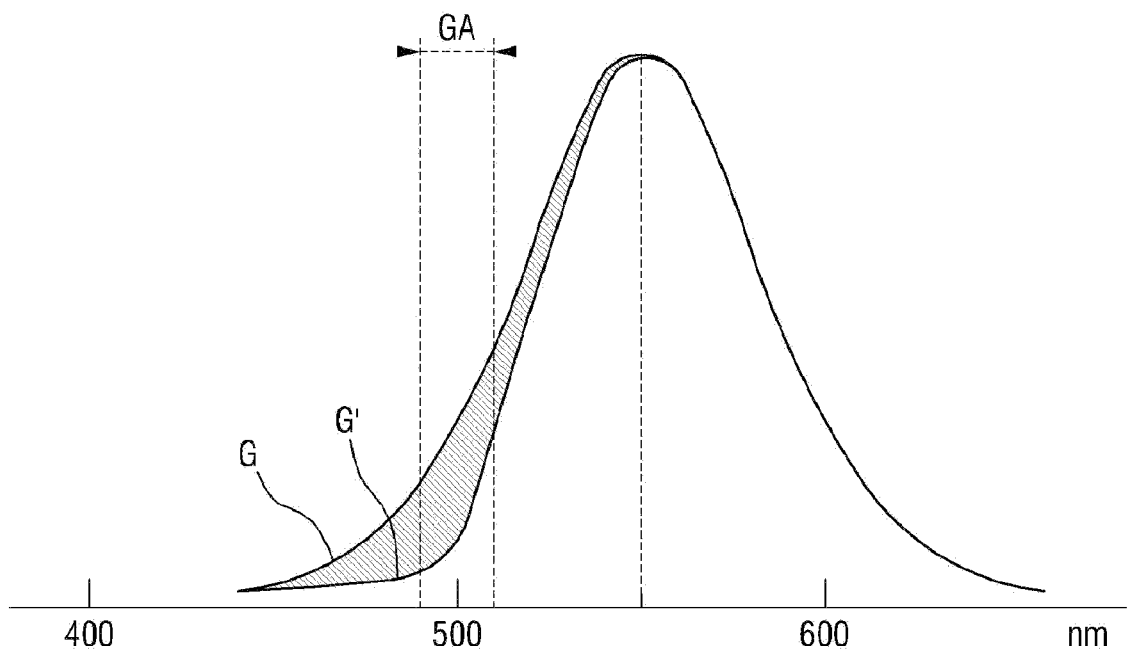
FIG. 4B is a diagram illustrating the wavelength distribution of green light that passed through the filler after having been emitted from the light-emitting element of FIG. 1.
Figure 4C:
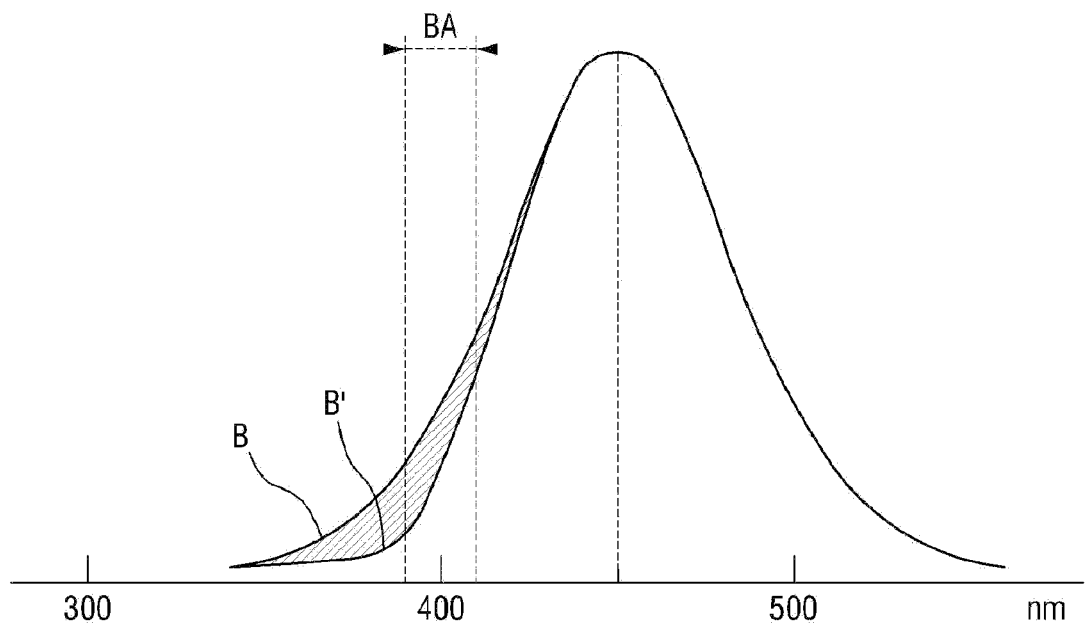
FIG. 4C is a diagram illustrating the wavelength distribution of blue light that passed through the filler after having been emitted from the light-emitting element of FIG. 1.

The filler 400 and the absorbing material of the display device according to the current exemplary embodiment will now be described with reference to FIGS. 3A through 4C. FIGS. 3A and 3B are diagrams illustrating the wavelength distribution of each color of light emitted from the light-emitting element 200 of FIG. 1. FIG. 4A is a diagram illustrating the wavelength distribution of red light R that passed through the filler 400 after having been emitted from the light-emitting element 200 of FIG. 1. FIG. 4B is a diagram illustrating the wavelength distribution of green light G that passed through the filler 400 after having been emitted from the light-emitting element 200 of FIG. 1. FIG. 4C is a diagram illustrating the wavelength distribution of blue light B that passed through the filler 400 after having been emitted from the light-emitting element 200 of FIG. 1.

In FIGS. 3A and 3B, the wavelength distribution of light emitted from the light-emitting element 200 and the position of a peak of the wavelength distribution are illustrated for each color.

The red light R emitted from the light-emitting element 200 peaks at a wavelength of 630 nm, and most wavelengths of the red light R fall within a range of 610 to 650 nm.

The green light G emitted from the light-emitting element 200 peaks at a wavelength of 550 nm, and most wavelengths of the green light G fall within a range of 530 to 570 nm.

The blue light B emitted from the light-emitting element 200 peaks at a wavelength of 450 nm, and most wavelengths of the blue light B fall within a range of 430 to 470 nm.

Light generated and emitted from the light-emitting element 200 has a unique wavelength for each color.

Color purity, as used herein, indicates how close emitted light is to a unique wavelength of each color. For example, a unique wavelength (i.e., the peak) of the red light R is 630 nm. Thus, the color purity of the red light R emitted from the light-emitting element 200 increases as the wavelength of the red light R becomes closer to 630 nm and decreases as the wavelength of the red light R becomes farther away from 630 nm.

Low color purity makes it difficult to accurately realize the color of each pixel. Accordingly, a desired image cannot be displayed, or a distorted image may be displayed. For this reason, color purity needs to be increased.

Referring to FIG. 3A, each of the red light R, the green light G, and the blue light B includes not only light of a wavelength at the peak of its wavelength distribution but also light of other wavelengths farther away from the peak. That is, since the light of the wavelength at the peak is mixed with the light of the other wavelengths, it is difficult to accurately realize each desired color.

Referring to FIG. 3B, light of adjacent wavelength regions P1 through P4 may be partially mixed with the red light R, the green light G and the blue light B, thereby reducing color purity.

Therefore, in the display device according to the current exemplary embodiment, a light-absorbing material which can absorb the light of the wavelength regions P1 through P4 from light emitted from the light-emitting element 200 can be mixed with the filler 400 to increase color purity.

Specifically, referring to FIG. 4A, the wavelength distribution of the red light R emitted from the light-emitting element 200 can be compared with the wavelength distribution of the red light R' that passed through the filler 400. A hatched area indicates the amount of light that is absorbed by a light-absorbing material when the red light R passes through the light-absorbing material contained in the filler 400. That is, a light-absorbing material which absorbs light in a wavelength region RA of 570 to 590 nm may be contained in the filler 400. The light-absorbing material absorbs unnecessary light of wavelengths (i.e., the light in the wavelength region RA of 570 to 590 nm) excluding a wavelength of 630 nm which is a unique wavelength of the red light R, thereby increasing the color purity of the red light R' that passes through the filler 400.

The light-absorbing material which absorbs the light in the wavelength region RA of 570 to 590 nm to increase the color purity of the red light R may include one or more of a cyanine-based material, a phenothiazine-based material, an azaporphyrin-based material, and a pyrromethene-based material.

The cyanine-based material may include 3,3'-diethyloxadicarbocyanine iodide (DODCI), 1,3'-diethyl-4,2'-quinolyoxacarbocyanide iodide (DQOCI), and 1,3'-diethyl-4,2'-quinolylthiacarbocyanine iodide (DQTCI).

Referring to FIG. 4B, the wavelength distribution of the green light G emitted from the light-emitting element 200 can be compared with the wavelength distribution of the green light G' that passed through the filler 400. A hatched area indicates the amount of light that is absorbed by a light-absorbing material when the green light G passes through the light-absorbing material contained in the filler 400. That is, a light-absorbing material which absorbs light in a wavelength region GA around 490 nm may be contained in the filler 400. The light-absorbing material absorbs unnecessary light of wavelengths (i.e., the light in the wavelength region GA around 490 nm) excluding a wavelength of 550 nm which is a unique wavelength of the green light G, thereby increasing the color purity of the green light G' that passes through the filler 400.

The light-absorbing material which absorbs the light in the wavelength region GA around 490 nm to increase the color purity of the green light G may include a pyrromethene-based material.

Referring to FIG. 4C, the wavelength distribution of the blue light B emitted from the light-emitting element 200 can be compared with the wavelength distribution of the blue light B' that passed through the filler 400. A hatched area indicates the amount of light that is absorbed by a light-absorbing material when the blue light B passes through the light-absorbing material contained in the filler 400. That is, a light-absorbing material which absorbs light in a wavelength region BA around 400 to 410 nm may be contained in the filler 400. The light-absorbing material absorbs unnecessary light of wavelengths (i.e., the light in a wavelength region BA around 400 to 410 nm) excluding a wavelength of 450 nm which is a unique wavelength of the blue light B, thereby increasing the color purity of the blue light B' that passes through the filler 400.

The light-absorbing material which absorbs the light in the wavelength region BA around 410 nm to increase the color purity of the blue light B may include a porphyrin-based material.

The filler 400 according to the current exemplary embodiment may include one or more of the above-described light-absorbing materials.

As described above, a light-absorbing material that absorbs light of a certain wavelength range may be spread within the filler 400. The light-absorbing material may absorb light of wavelengths excluding a unique wavelength of each color when light emitted from the light-emitting element 200 passes through the filler 400. Consequently, the display device with improved color purity and constant transparency and luminance can be provided. In addition, since the existing light-emitting element 200 can be used as it is, the display device configured to easily enhance color purity without a significant increase in cost can be provided.

Figure 5:
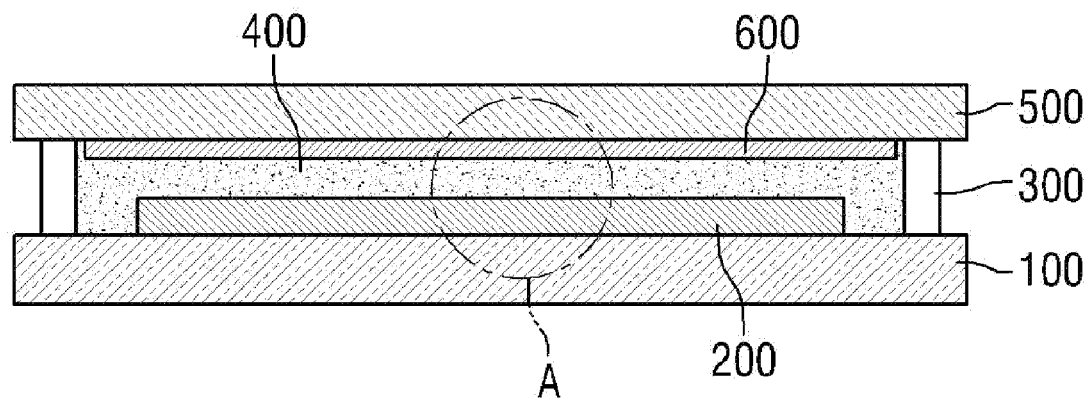
FIG. 5 is a cross-sectional view illustrating the schematic structure of a display device according to another exemplary embodiment of the present disclosure.
Figure 6:
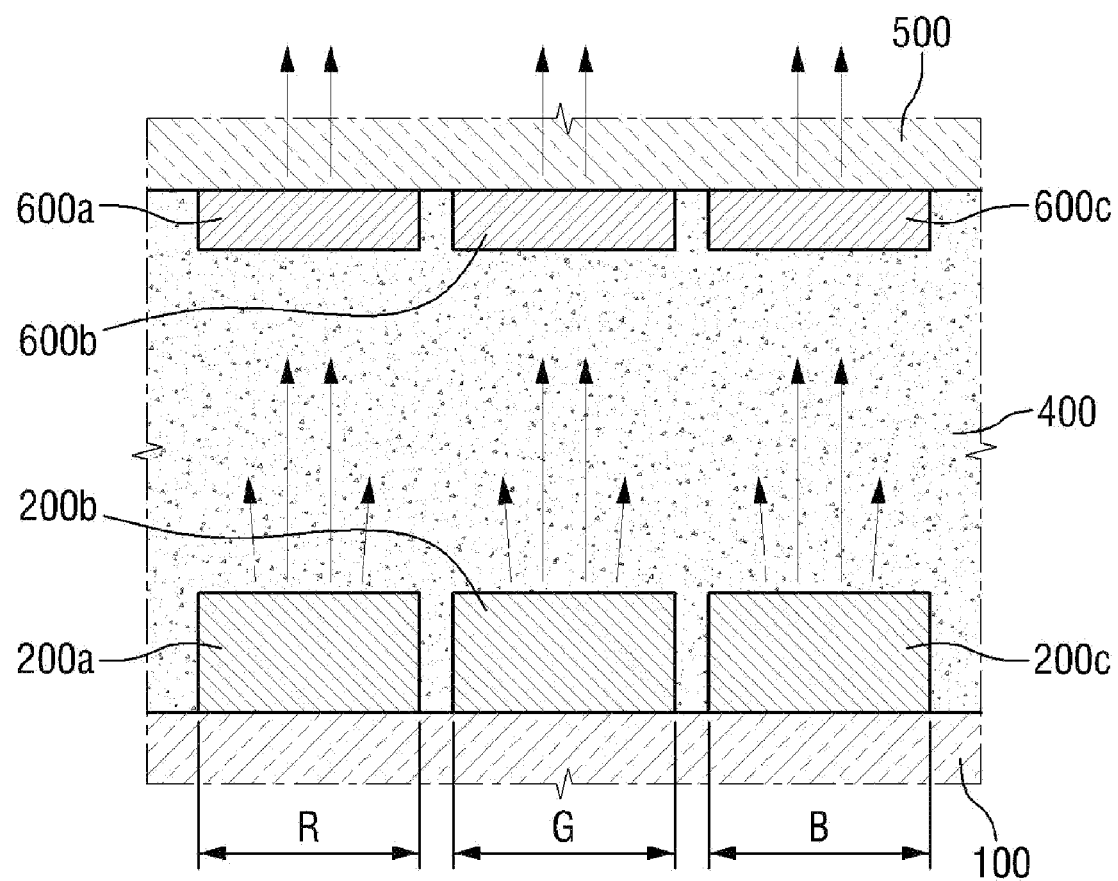
FIG. 6 is an enlarged cross-sectional view of a region A shown in FIG. 5.

Hereinafter, a display device according to another exemplary embodiment of the present disclosure will be described with reference to FIGS. 5 and 6. FIG. 5 is a cross-sectional view illustrating the schematic structure of a display device according to another exemplary embodiment of the present disclosure. FIG. 6 is an enlarged cross-sectional view of a region A shown in FIG. 5.

The display device according to the current exemplary embodiment includes a lower substrate 100, a light-emitting element 200 formed on the lower substrate 100 and including a plurality of pixels, an upper substrate 500 disposed on the light-emitting element 200 with a gap therebetween sealed with a sealant 300, a filler 400 filling the gap between the light-emitting element 200 and the upper substrate 500, and a light-absorbing layer 600 formed between the lower substrate 100 and the upper substrate 500 and absorbing light of a certain wavelength range. Each of the pixels includes a plurality of subpixels, each emitting light of red, green or blue, and the light-absorbing layer 600 can be formed at a position corresponding to each subpixel and contains a material that absorbs light of a different wavelength region for each subpixel.

Referring to FIG. 5, the configuration of the display device according to the current exemplary embodiment is the same as that of the display device according to the previous exemplary embodiment, except that the light-absorbing layer 600 is provided as a separate component instead of having a light-absorbing material mixed with and spread within the filler 400.

In the example of FIG. 5, the light-absorbing layer 600 may be coated on a surface of the upper substrate 500. However, the present embodiments are not limited thereto. The light-absorbing layer 600 can also be formed at a predetermined position in a direction in which light emitted from the light-emitting element 200 proceeds.

As described above in the previous exemplary embodiment, the light-absorbing layer 600 may contain a light-absorbing material that selectively absorbs light of a certain wavelength range. Specifically, the light-absorbing layer 600 may include a porphyrin-based material which absorbs light in a wavelength of 410 nm, a pyrromethene-based material which absorbs light in a wavelength of 490 nm, or one or more of a cyanine-based material, a phenothiazine-based material, an azaporphyrin-based material and a pyrromethene-based material which absorb light in a wavelength of 580 nm.

Referring to FIG. 6, first through third light-absorbing layers 600a through 600c may be selectively formed at positions corresponding to the pixels or at positions corresponding to the subpixels.

Each pixel may include three subpixels of red, green and blue, and the first through third light-absorbing layers 600a through 600c may be formed at positions corresponding to the subpixels, respectively. Each of the first through third light-absorbing layers 600a through 600c may be made of a material that absorbs light of a certain wavelength region for a corresponding subpixel.

Specifically, the first light-absorbing layer 600a is formed over a light-emitting element 200a at a position corresponding to the light-emitting element 200a which emits red light R. The first light-absorbing layer 600a may contain a light-absorbing material that absorbs light of a wavelength region near the peak of the red light R. The second light-absorbing layer 600b may contain a light-absorbing material that absorbs light of a wavelength region near the peak of green light G. The third light-absorbing layer 600c may contain a light-absorbing material that absorbs light of a wavelength region near the peak of blue light B.

In some embodiments, the proportion of light at the peak can be increased to improve color purity by absorbing light of a wavelength region near the peak of each color, and the improved color purity can increase the color reproducibility of the display device.

In some embodiments, the first light-absorbing layer 600a formed at a position corresponding to a subpixel which emits the red light R may include one or more of a cyanine-based material, a phenothiazine-based material, an azaporphyrin-based material, and a pyrromethene-based material which absorb light in a wavelength of 580 nm.

In some embodiments, the second light-absorbing layer 600b formed at a position corresponding to a subpixel which emits the green light G may include a pyrromethene-based material which absorbs light in a wavelength of 490 nm.

In some embodiments, the third light-absorbing layer 600c formed at a position corresponding to a subpixel which emits the blue light B may include a porphyrin-based material which absorbs light in a wavelength of 410 nm.

Figure 7:
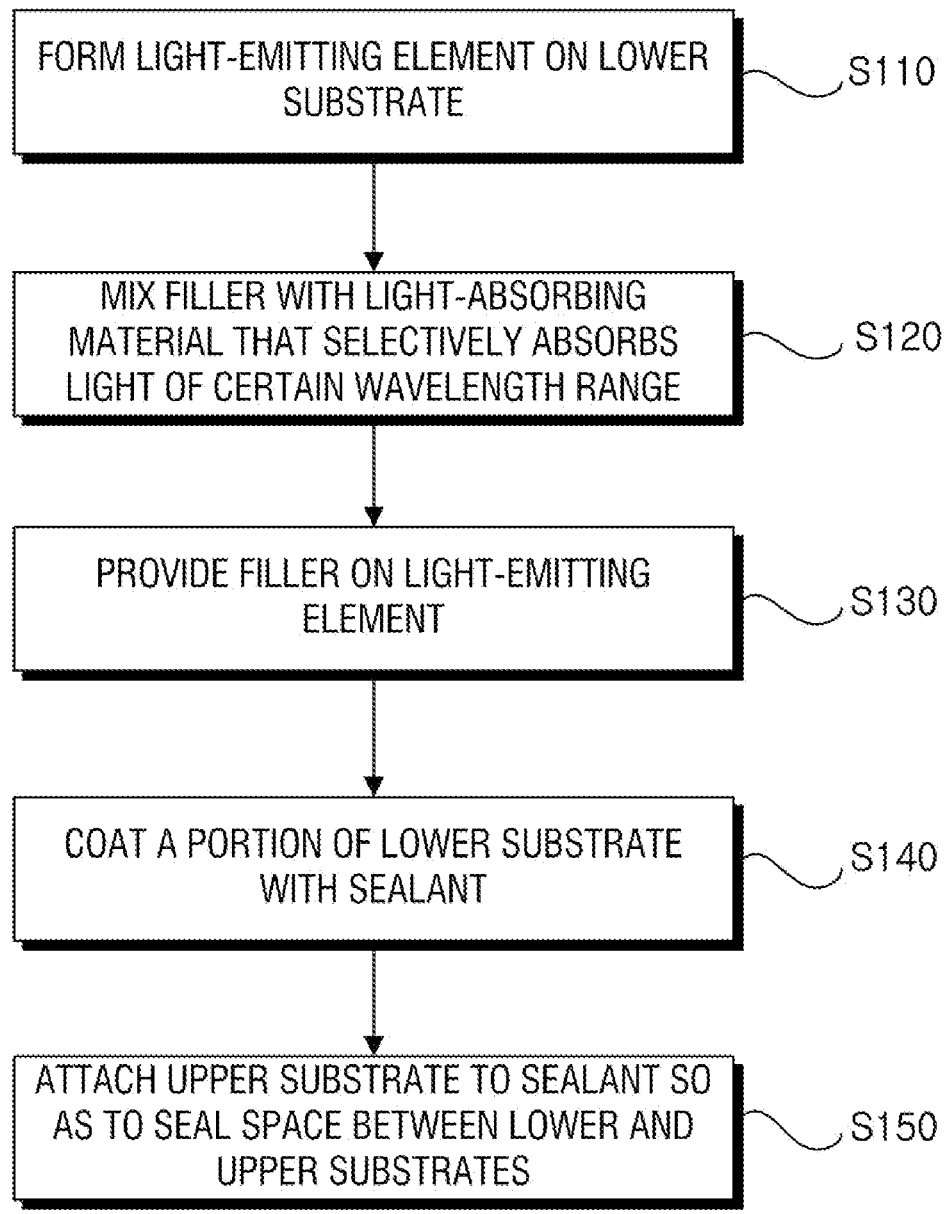
FIG. 7 is a flowchart illustrating a method of manufacturing a display device according to an exemplary embodiment of the present disclosure.
Figure 8:
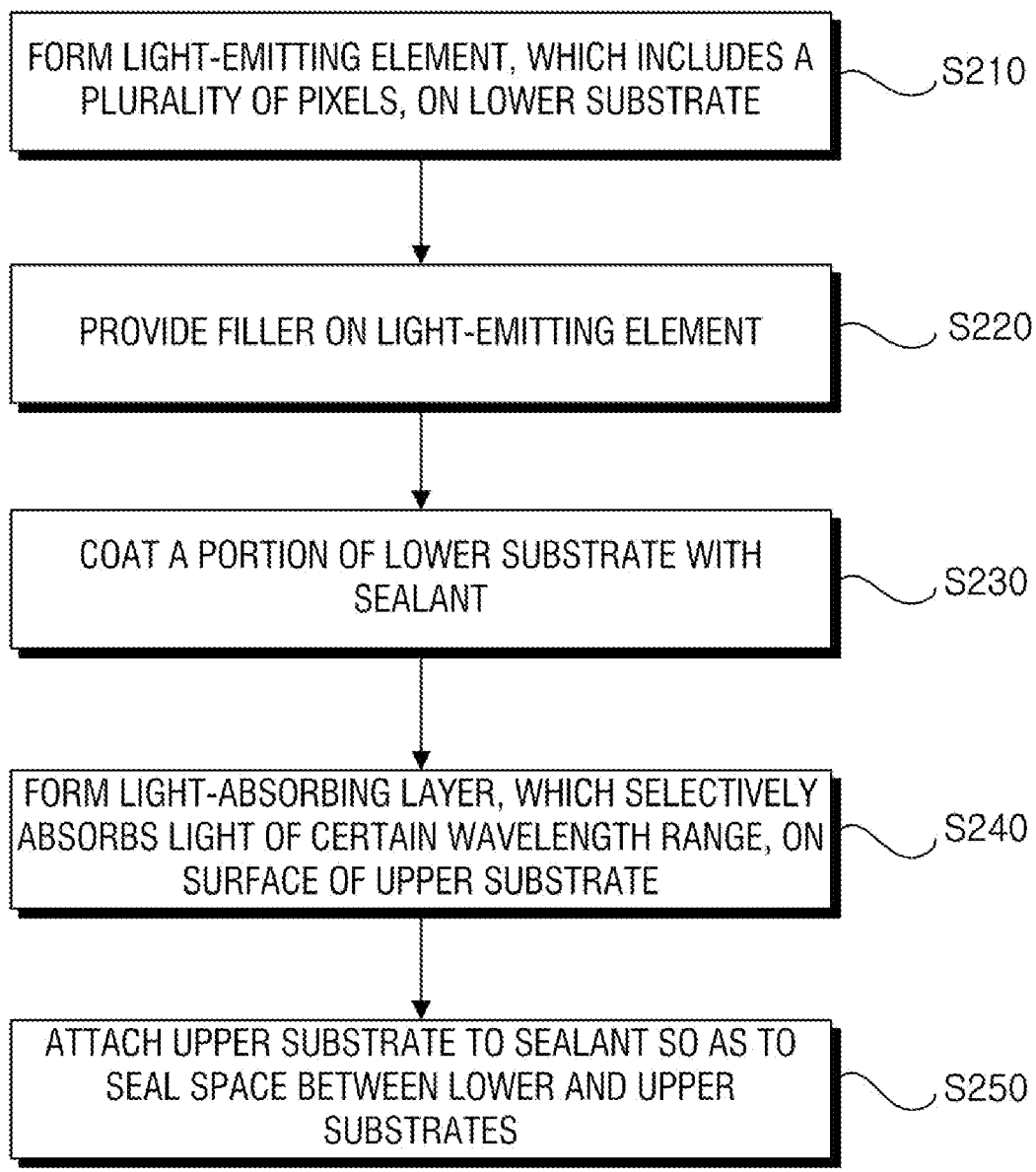
FIG. 8 is a flowchart illustrating a method of manufacturing a display device according to another exemplary embodiment of the present disclosure.

Hereinafter, methods of manufacturing a display device according to exemplary embodiments of the present disclosure will be described with reference to FIGS. 7 and 8. FIG. 7 is a flowchart illustrating a method of manufacturing a display device according to an exemplary embodiment of the present disclosure. FIG. 8 is a flowchart illustrating a method of manufacturing a display device according to another exemplary embodiment of the present disclosure.

The method of manufacturing a display device according to the exemplary embodiment of FIG. 7 includes forming a light-emitting element on a lower substrate (operation S110), providing a filler and mixing the filler with a light-absorbing material which selectively absorbs light of a certain wavelength range (operation S120), providing the filler on the light-emitting element (operation S130), coating a portion of the lower substrate with a sealant (operation S140), and attaching an upper substrate to the sealant so as to seal a space between the lower substrate and the upper substrate (operation S150).

Specifically, a light-emitting element is formed on a lower substrate (operation S110). As described above, the light-emitting element may include liquid crystals which are driven by an electric field generated by a TFT of each pixel. In addition, the light-emitting element may be an organic light-emitting element in which an organic light-emitting layer emits light by itself in response to an electric field formed by the TFT of each pixel. In this case, the light-emitting element may include a plurality of organic light emitters connected in a matrix pattern between a plurality of scan lines and a plurality of data lines to define the pixels, respectively.

In some embodiments, the light-emitting element may include a buffer layer, a semiconductor layer, a gate insulating film, a gate electrode, a first interlayer insulating film, source/drain electrodes, a second interlayer insulating film, a pixel electrode, a pixel defined layer, an organic light-emitting layer, and a common electrode stacked sequentially on the lower substrate. However, the configuration of the light-emitting element is not limited to this example.

Next, a filler can be provided and can be mixed with a light-absorbing material which absorbs light of a certain wavelength range (operation S120). As described above, the light-absorbing material may include a porphyrin-based material which absorbs light in a wavelength of 410 nm, a pyrromethene-based material which absorbs light in a wavelength of 490 nm, or one or more of a cyanine-based material, a phenothiazine-based material, an azaporphyrin-based material and a pyrromethene-based material which absorb light in a wavelength of 580 nm.

In embodiments that include mixing of the filler with the light-absorbing material, the light-absorbing material may be dispersed and dissolved in a solvent and then mixed with the filler. In some embodiments, the light-absorbing material may be dissolved in 100 nm or less of pigment or an organic solvent such as alcohol in order to minimize the effect of the light-absorbing material on the transmittance of the filler.

Next, the filler can be provided on the light-emitting element (operation S130). In some embodiments, the filler may be provided on the filler using various known methods such as a printing method, a one drop filling (ODF) method, a dispensing method, and an inkjet method.

In some embodiments, a portion of the lower substrate can be coated with a sealant (operation S140), and an upper substrate can be attached to the sealant such that a space between the lower substrate and the upper substrate can be sealed with the sealant, thereby completing an encapsulation process (operation S150).

The method of manufacturing a display device according to the exemplary embodiment of FIG. 8 includes forming a light-emitting element, which includes a plurality of pixels, on a lower substrate (operation S210), providing a filler on the light-emitting element (operation S220), coating a portion of the lower substrate with a sealant (operation S230), forming a light-absorbing layer, which selectively absorbs light of a certain wavelength range, on a surface of an upper substrate (operation S240), and attaching the upper substrate to the sealant so as to seal a space between the lower substrate and the upper substrate (operation S250).

The manufacturing method according to the current exemplary embodiment is the same as the manufacturing method according to the previous exemplary embodiment except that the light-absorbing layer selectively absorbing light of a certain wavelength range can be formed on a surface of the upper substrate to be separate from the filler.

In some embodiments, the forming of the light-absorbing layer (operation S240) may include dispersing and dissolving the light-absorbing material in a solvent and coating the light-absorbing material on the surface of the upper substrate. Forming the light-absorbing layer by coating the upper substrate with the light-absorbing material may be performed using a conventional coating method such as a spin coating method, a spray coating method, a printing method, a dispensing method, or an inkjet printing method.

In the forming of the light-absorbing layer (operation S240), the light-absorbing material may be formed at positions corresponding to the pixels, and each of the pixels may include subpixels which emit red light, green light and blue light.

In the forming of the light-absorbing layer (operation S240), the light-absorbing layer may be formed at a position corresponding to each subpixel and may contain a light-absorbing material which absorbs light of a different wavelength region for each subpixel.

In some embodiments, the light-absorbing material which forms the light-absorbing layer may include a porphyrin-based material which absorbs light in a wavelength of 410 nm, a pyrromethene-based material which absorbs light in a wavelength of 490 nm, or one or more of a cyanine-based material, a phenothiazine-based material, an azaporphyrin-based material and a pyrromethene-based material which absorb light in a wavelength of 580 nm.

Exemplary embodiments of the present invention may provide one or more of the following advantages.

A light-absorbing material that absorbs light of a certain wavelength range is dispersed within a filler filling a space between an upper substrate and a lower substrate. Therefore, a display device with improved color purity and constant transparency and luminance can be provided.

In addition, since the existing light-emitting element can be used as it is, a display device configured to easily enhance color purity without a significant increase in cost can be provided.

However, the effects of the present embodiments are not restricted to the one set forth herein. The above and other effects of the present embodiments will become more apparent to one of skill in the art to which the present embodiments pertain by referencing the claims.

What is claimed is:

1. A display device comprising:
   a lower substrate;
   a light-emitting element formed on the lower substrate and comprising a plurality of pixels, wherein each of the pixels consists essentially of a single light emitting layer configured to emit light with a wavelength distribution including a single peak wavelength;
   an upper substrate disposed on the light-emitting element with a gap therebetween sealed with a sealant;
   a filler filling the gap between the light-emitting element and the upper substrate; and
   a light-absorbing material formed between the lower substrate and the upper substrate and selectively absorbing light of a certain wavelength range excluding the peak wavelength.

2. The display device of claim 1, wherein the light-absorbing material is mixed with the filler.

3. The display device of claim 1, wherein the light-absorbing material is formed at positions corresponding to the pixels.

4. The display device of claim 1, wherein the light-absorbing material is coated on a surface of the upper substrate.

5. The display device of claim 1, wherein the light-absorbing material comprises a porphyrin-based material which absorbs light in a wavelength of 410 nm.

6. The display device of claim 1, wherein the light-absorbing material comprises a pyrromethene-based material which absorbs light in a wavelength of 490 nm.

7. The display device of claim 1, wherein the light-absorbing material comprises one or more of a cyanine-based material, a phenothiazine-based material, an azaporphyrin-based material, and a pyrromethene-based material which absorb light in a wavelength of 580 nm.

8. A display device comprising:
   a lower substrate;
   a light-emitting element formed on the lower substrate and comprising a plurality of pixels, each comprising a plurality of subpixels;
   an upper substrate disposed on the light-emitting element with a gap therebetween sealed with a sealant;
   a filler filling the gap between the light-emitting element and the upper substrate; and
   a light-absorbing layer formed between the lower substrate and the upper substrate and selectively absorbing light of a certain wavelength range,
   wherein each of the pixels comprises a plurality of subpixels, each of which consists essentially of a single light emitting layer configured to emit one of red light, green light, and blue light, and the light-absorbing layer is formed at a position corresponding to each of the subpixels,
   wherein the red, green and blue light emitted from each of the light emitting layers respectively has a wavelength distribution including a single peak wavelength,
   wherein the light-absorbing layer formed at a position corresponding to a subpixel which emits the red light absorbs light of a wavelength region lower than the peak wavelength of the red light,
   wherein the light-absorbing layer formed at a position corresponding to a subpixel which emits the green light absorbs light of a wavelength region lower than the peak wavelength of the green light, and
   wherein the light-absorbing layer formed at a position corresponding to a subpixel which emits the blue light absorbs light of a wavelength region lower than the peak wavelength of the blue light.

9. The display device of claim 8, wherein the light-absorbing layer comprises a porphyrin-based material which absorbs light in a wavelength of 410 nm, a pyrromethene-based material which absorbs light in a wavelength of 490 nm, or one or more of a cyanine-based material, a phenothiazine-based material, an azaporphyrin-based material and a pyrromethene-based material which absorb light in a wavelength of 580 nm.

10. The display device of claim 8, wherein the light-absorbing layer formed at a position corresponding to a subpixel which emits the red light comprises one or more of a cyanine-based material, a phenothiazine-based material, an azaporphyrin-based material, and a pyrromethene-based material which absorb light in a wavelength of 580 nm.

11. The display device of claim 8, wherein the light-absorbing layer formed at a position corresponding to a subpixel which emits the green light comprises a pyrromethene-based material which absorbs light in a wavelength of 490 nm.

12. The display device of claim 8, wherein the light-absorbing layer formed at a position corresponding to a subpixel which emits the red light comprises a porphyrin-based material which absorbs light in a wavelength of 410 nm.

13. A display device comprising:
   a lower substrate;
   a light-emitting element formed on the lower substrate and comprising a plurality of pixels;
   an upper substrate disposed on the light-emitting element with a gap therebetween sealed with a sealant;
   a filler filling the gap between the light-emitting element and the upper substrate; and
   a light-absorbing layer formed between the lower substrate and the upper substrate, wherein each of the pixels comprises a plurality of subpixels, each of which consists essentially of a single light emitting layer configured to emit one of red light, green light, and blue light, wherein the red, green and blue light emitted from each of the light emitting layers respectively has a wavelength distribution including a single peak wavelength region comprising the majority of the wavelengths emitted from the respective light emitting layer, wherein the light-absorbing layer absorbs light of wavelength regions adjacent to the peak wavelength regions of the red light, the green light, and blue light.

14. The display device of claim 13, wherein the wavelength regions comprises a first wavelength region, a second wavelength region, a third wavelength region, and a fourth wavelength region, wherein the first wavelength region is lower than the peak wavelength region of the blue light, wherein the second wavelength region is between the peak wavelength region of the blue light and the peak wavelength region of the green light, wherein the third wavelength region is between the peak wavelength region of the green light and the peak wavelength region of the red light, and wherein the fourth wavelength region is higher than the peak wavelength region of the red light.

15. The display device of claim 13, wherein the light-absorbing layer transmits the light of the wavelengths at the peaks of the wavelength distribution of the red light, the wavelength distribution of the green light, and the wavelength distribution of the blue light.

16. The display device of claim 1, wherein the light-absorbing material is substantially evenly distributed over all of the pixels.

17. The display device of claim 8, wherein the light-absorbing layer formed at the position corresponding to the subpixel which emits the red light absorbs light of only the wavelength region lower than the peak wavelength of the red light, wherein the light-absorbing layer formed at the position corresponding to the subpixel which emits the green light absorbs light of only the wavelength region lower than the peak wavelength of the green light, and wherein the light-absorbing layer formed at the position corresponding to the subpixel which emits the blue light absorbs light of only the wavelength region lower than the peak wavelength of the blue light.

18. The display device of claim 13, wherein the light-absorbing layer comprises a light-absorbing material that is substantially evenly distributed over all of the pixels.

* * * * *